(12) United States Patent
Hughson et al.

(10) Patent No.: US 6,257,903 B1
(45) Date of Patent: Jul. 10, 2001

(54) SELF-DOCKING ELECTRICAL CONNECTOR

(75) Inventors: Douglas Hughson, White Lake; Paul Douglas Schryer, Canton, both of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/245,530

(22) Filed: Feb. 5, 1999

(51) Int. Cl.$^7$ ............................................ H01R 12/00
(52) U.S. Cl. ................................... 439/77; 439/660
(58) Field of Search ........................... 439/67, 492, 77, 439/495, 660, 56, 813

(56) References Cited

U.S. PATENT DOCUMENTS

| | | | |
|---|---|---|---|
| 4,719,322 | * | 1/1988 | Guzik et al. .......................... 200/5 A |
| 5,288,249 | * | 2/1994 | Fitgerald ................................. 439/56 |
| 5,292,264 | * | 3/1994 | Blank ..................................... 439/813 |
| 5,295,843 | * | 3/1994 | Davis et al. .......................... 439/660 |

FOREIGN PATENT DOCUMENTS

| | | | | |
|---|---|---|---|---|
| 1496312 | * | 5/1994 | (FR) | ...................................... 439/492 |
| 4237496 A1 | * | 5/1994 | (DE) | ...................................... 439/492 |

* cited by examiner

*Primary Examiner*—Renee Luebke
*Assistant Examiner*—Briggitte Hammond
(74) *Attorney, Agent, or Firm*—Mark Mollon

(57) ABSTRACT

An electrical connector 100 for drop-in connection of an electronic module 50 (such as an audio speaker assembly) having at least two lead wires 52, to a flex circuit 70 having a like number of circuit traces 72 arranged on a mounting surface 60, comprising: (1) an electrically insulative body 10 having generally opposed first and second major surfaces 12/14; and (2) at least two electrically conductive, generally elongate biasing members 20 disposed within the body, each biasing member having first and second ends 22/24 and a contact region 26 proximate the second end, wherein each first end 22 is exposed through the first major surface 12 and is adapted for attachment to one of the lead wires 52, and wherein each contact region 26 extends outward from the second major surface 14 such that each contact region may be resiliently deflected inward toward the second major surface.

3 Claims, 3 Drawing Sheets

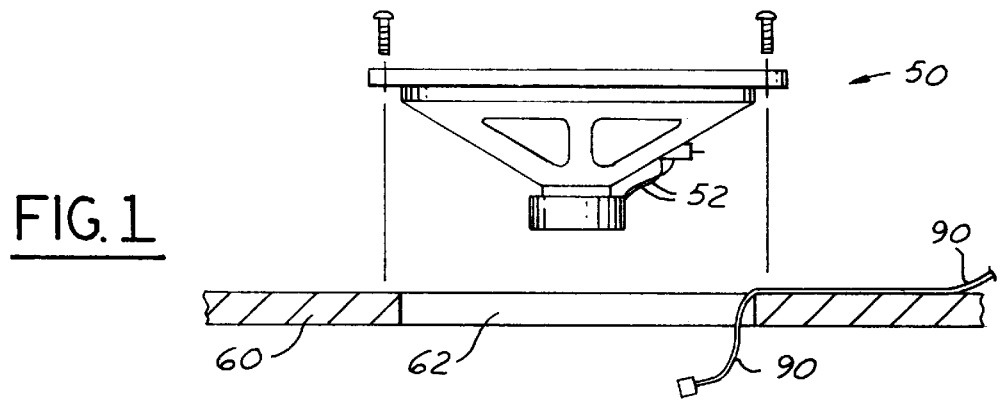
FIG. 1
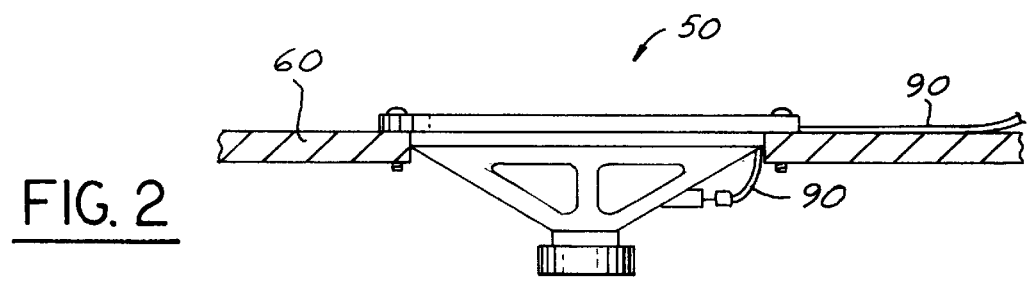
FIG. 2
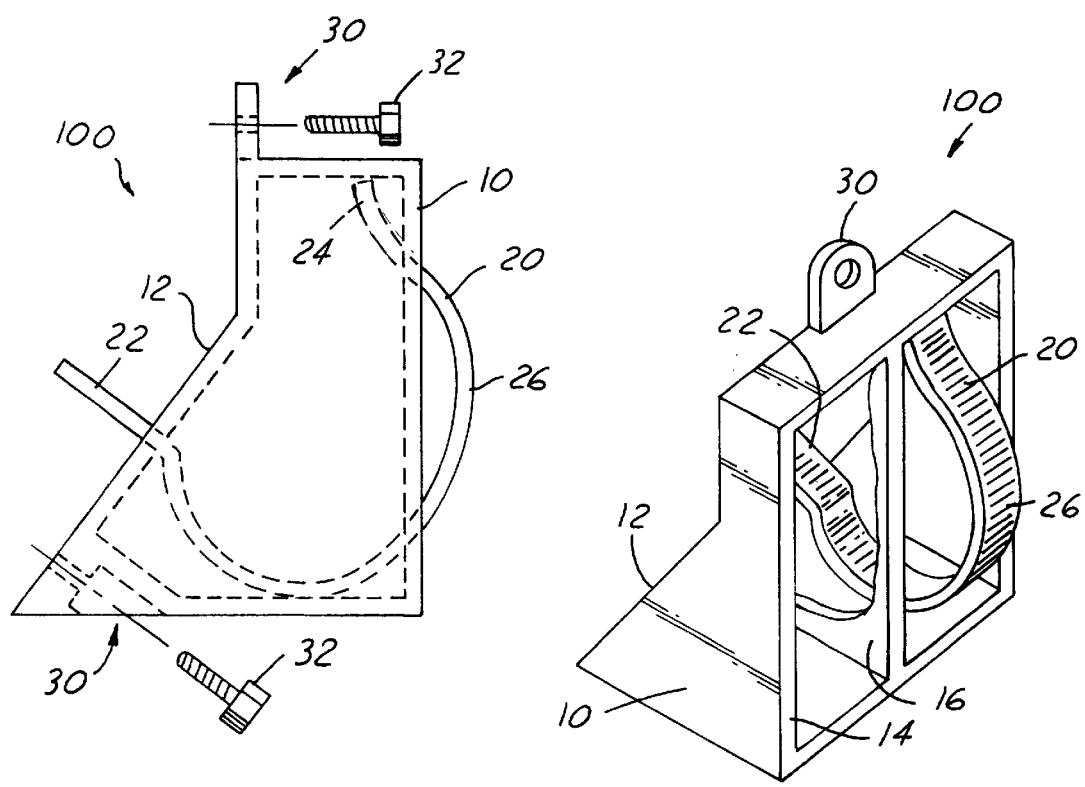
FIG. 3
FIG. 4

SELF-DOCKING ELECTRICAL CONNECTOR

BACKGROUND OF THE INVENTION

1. Field of the Invention

The present invention relates generally to electrical connectors, and more particularly to electrical connectors for use with flex circuitry.

2. Disclosure Information

FIGS. 1–2 illustrate the typical method for mechanically mounting an electronic module 50 into a hole or cavity 62 within a mounting surface 60, and effecting electrical connection between lead wires 52 of the module and the external wiring 90. As illustrated here, the electronic module 50 may be an audio speaker assembly and the mounting surface 60 may be an automotive door, package tray, or other passenger compartment surface, for example; alternatively, the electronic module 50 may be an audio power amplifier, an electronic control module for one or more electronic/electrical systems, or the like, and the mounting surface 60 may be a speaker enclosure, a plastic molded housing, or the like. As shown in FIGS. 1–2, it is conventional practice to either (1) connect the module's lead wires 52 to the external wiring 90 and then mount the connected module within the mounting surface, or (2) mount the module in the hole first and then connect the lead wires to the external wiring.

In the case of audio speaker assemblies installed in a motor vehicle, each lead wire 52 is soldered to a male blade connector, with the two or more blade connectors being affixed side-by-side to the exterior surface of the speaker frame and extending outward therefrom. The corresponding external wiring 90 is typically conventional round wire, with female blade-receiving connectors soldered onto the round wire ends. For automotive applications using conventional round wire, the aforementioned arrangement is acceptable. However, when flex circuitry is used instead of round wire, it is very difficult and impractical to connect the flex to the speaker's male blade connectors using the aforementioned conventional approach. In addition, there are many applications where it would be desirable to utilize flex circuits as the external wiring and to effect both electrical connection and mechanical mounting of the module simultaneously, rather than as two separate steps as described above. It would be desirable, therefore, to provide a way of connecting speaker assemblies and other electronic modules having lead wires to flex circuit external wiring without the aforementioned drawbacks, while also enabling simultaneous electrical and mechanical connection of the module.

SUMMARY OF THE INVENTION

The present invention overcomes the disadvantages of the prior art approaches by providing an article and method for connecting electronic modules having lead wires to external flex circuits.

It is an object and advantage that the present invention provides electrical connection between the module lead wires and the external flex circuitry simultaneous with the mechanical mounting of the module onto a mounting surface.

These and other advantages, features and objects of the invention will become apparent from the drawings, detailed description and claims which follow.

BRIEF DESCRIPTION OF THE DRAWINGS

FIGS. 1–2 are sectional side views of an electronic module before and after installation onto a mounting surface, respectively, according to the prior art.

FIGS. 3–4 are perspective and sectional side views, respectively, of an electrical connector according to the present invention.

DETAILED DESCRIPTION OF THE PREFERRED EMBODIMENTS

Figure 5:
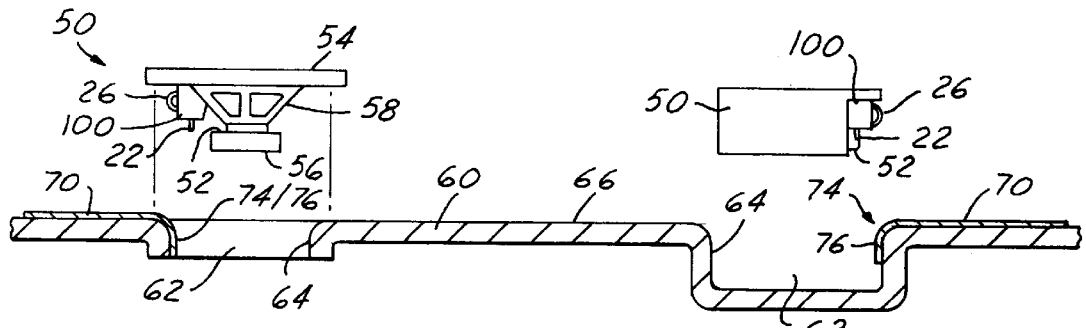
FIGS. 5–6 are side sectional views of an electronic module, mounting surface, flex circuit external wiring, and connector according to the present invention before and after drop-in connection, respectively.

Referring now to the drawings, FIGS. 3–13, and particularly FIGS. 3–4, show an electrical connector 100 for drop-in connection of an electronic module 50 (such as an audio speaker assembly) having at least two lead wires 52, to a flex circuit 70 having a like number of circuit traces 72 arranged on a mounting surface 60, according to the present invention. The connector 100 comprises: (1) an electrically insulative body 10 having generally opposed first and second major surfaces 12/14; and (2) at least two electrically conductive, generally elongate biasing members 20 disposed within the body, each biasing member having first and second ends 22/24 and a contact region 26 proximate the second end, wherein each first end 22 is exposed through the first major surface 12 and is adapted for attachment to one of the lead wires 52, and wherein each contact region 26 extends outward from the second major surface 14 such that each contact region may be resiliently deflected inward toward the second major surface.

To assist the reader in understanding the present invention, all reference numbers used herein are summarized in the table below, along with the elements they represent:

10=Body
12=First major surface of body
14=Second major surface of body
16=Wall portion of body
18=Receptacle/cell recessed in first surface
19=Interior wall of receptacle/cell
20=Biasing member
22=First end of biasing member
24=Second end of biasing member
26=Contact region of biasing member
30=Means for attaching body to module
32=Fastener for use with means for attaching
50=Electronic module (e.g., speaker assembly)
52=Lead wires of electronic module
54=Top surface of the module
56=Bottom surface of the module
58=Side wall(s) of the module
60=Mounting surface (e.g., package tray)
62=Hole/cavity in mounting surface
64=Lip/descending wall of hole/cavity
66=General top surface of mounting surface
68=Locating features for guiding/holding flex
70=Flex circuit 72=Circuit traces of flex circuit 74=End of flex placed adjacent the hole/cavity 76=Exposed terminations at end of flex circuit 80=Guide/locating pins on mounting surface 90=External wiring (e.g., round wire)

100=Connector according to the present invention

The body 10 is typically made of plastic, such as by injection molding. The generally opposed first and second major surfaces 12/14 may be completely opposed (i.e., generally parallel to one another), as in FIG. 3, or may be only partially or obliquely opposed (i.e., generally adjacent one another), as in FIG. 12. In order to keep adjacent biasing members 20 separated from one another (i.e., to avoid shorting or cross-talk), a wall portion 16 may be formed in the body 10 between adjacent biasing members 20.

Figure 13:
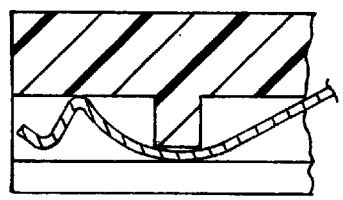

The biasing members 20 are typically metallic leaf springs stamped from sheet metal, which are then bent into a predetermined shape, as exemplified in FIGS. 3–4. The biasing members 20 may be insert-molded into the body 10 (i.e., placed into the mold prior to injection of resin), or may be inserted into the body in a post-molding step. The first end 22 of the biasing member is configured for attachment to a lead wire 52, either by having a male connector shape (e.g., a solder lug or screw lug), or a female connector shape (e.g., a crimp tube or female jack). A special type of male connector shape is illustrated in FIG. 13, where the first end 22 lies recessed beneath the first major surface within a receptacle or cell 18 formed in the first surface; here, the first end 22 is disposed very close to or touching an interior wall 19 of the receptacle 18, so that the lead wire 52 may be inserted therebetween and be gripped by an interference fit between the receptacle wall 19 and the deflected first end 22. Regardless of whether a male or female configuration is given to the first end 22, the first end must be exposed through the first major surface. This exposure is necessary to enable attachment of the first end to the module lead wire 52, and may be effected in either of two ways: (1) by the first end 22 extending outward from the first major surface 12, as in FIG. 3, or (2) by the first end being recessed within the body and not extending outward beyond the first major surface, as in FIG. 13.

The connector 100 may further include one or more means 30 for attaching the body of the connector to the exterior surface 54 of the electronic module 50, such that the second major surface 14 of the connector body 10 faces outward from the module. This attachment means 30 may include a flange with a hole therethrough (as in FIG. 3), a captive male fastener (as in FIG. 13), or the like.

Figure 6:
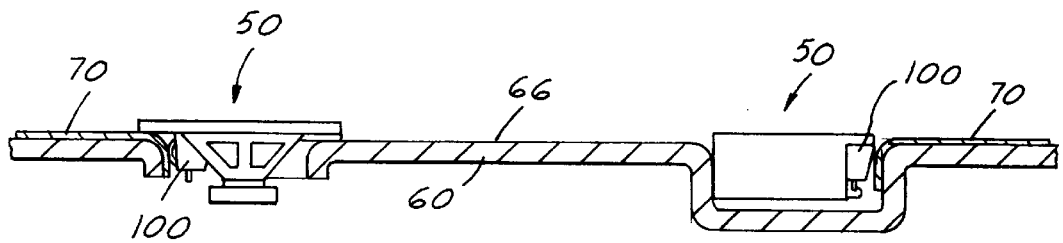
Figure 7:
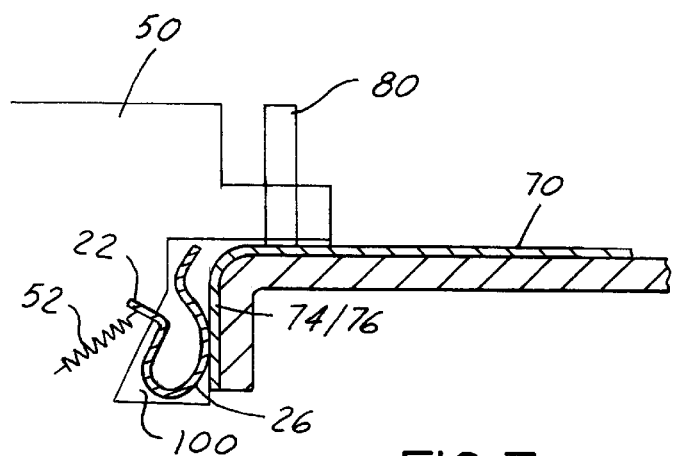
FIG. 7 is an enlarged view of a portion of the structure shown in FIG. 6
Figure 8:
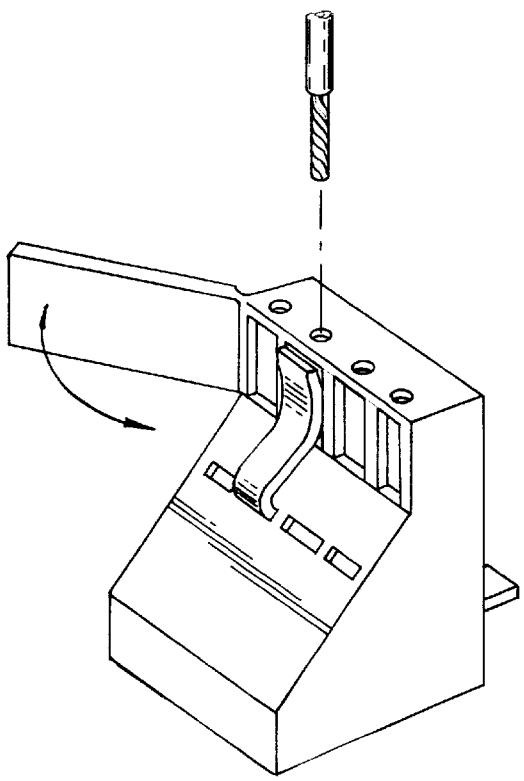
FIGS. 8–11 are perspective, partial sectional side, top, and front views, respectively, of an alternative embodiment according to the present invention.
Figure 9:
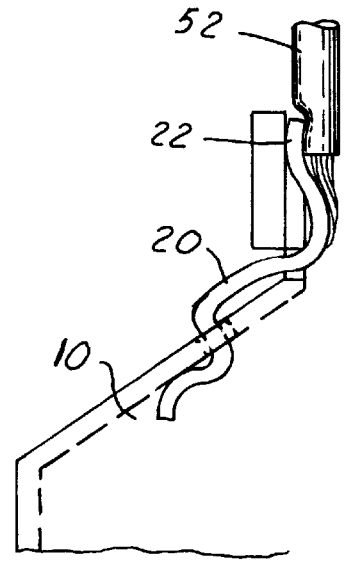
Figure 10:
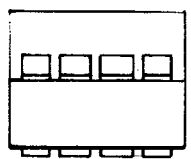
Figure 12:
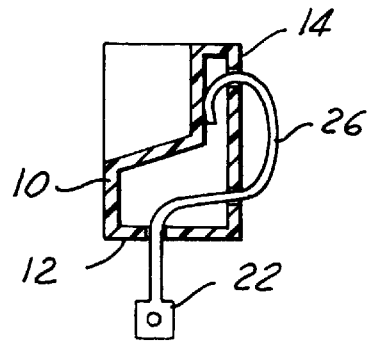
FIGS. 12–13 are sectional side views of additional alternative embodiments according to the present invention.
Figure 11:
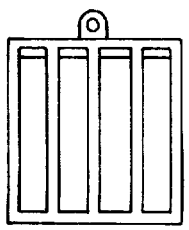

The electronic module 50 has a top surface 54, an opposed bottom surface 56, and one or more side walls 58 (depending on whether the module is round or rectangular/polygonal as viewed from above). As used here, the bottom surface 56 is that surface, face, or side of the module that is inserted into the hole or surface cavity 62 of the mounting surface 60, with the top surface 54 being that opposed surface, face, or side which faces "up" from the mounting surface 60. When the top and bottom module surfaces 54/56 are generally of the same size, the side wall(s) 58 are generally "straight" (i.e., generally perpendicular to the top and bottom surfaces 54/56), thus imparting a generally rectangular profile to the module as viewed from the side, as illustrated in FIGS. 5–6. On the other hand, when the top surface 54 is generally larger than the bottom surface 56, the side wall(s) are generally "angled" (i.e., generally oblique with respect to the top and bottom surfaces), thus imparting a generally trapezoidal profile to the module as viewed from the side, as in FIGS. 5–6. In either case, the hole or surface cavity 62 of the mounting surface 60 will have descending walls or lips 64 therein, which are preferably generally "straight" (i.e., generally perpendicular to the "top" surface 66 of the mounting surface, and generally perpendicular to the top and bottom modules surfaces 54/56 as installed) as in FIGS. 5–7.

With the foregoing configurations in mind, it is preferable that the first surface 12 of the connector body 10 generally conform in shape and angularity with the module side wall 58 to which the body 10 is connected. Likewise, the second surface 14 of the connector body 10 preferably conforms in shape and angularity with the descending wall or lip 64 of the mounting surface hole/cavity 62.

A method for using the connector 100 of the present invention involves the following steps. First, an electronic module 50, connector 100, flex circuit external wiring 70, and mounting surface 60 with a hole or surface cavity 62 therein are provided. Second, the connector 100 is mechanically attached to the side wall 58 of the module 50 with the lead wires 52 electrically connected to the respective first ends 22 of the biasing means 20. Third, the flex 70 is draped and/or attached to the general top surface 66 of the mounting surface 60 such that an end 74 of the flex is disposed upon the descending wall/lip 64 of the hole or cavity 62 with exposed portions 76 of the flex circuit traces 72 facing inward toward the center of the hole/cavity 62. And fourth, the module 50 with connector 100 attached thereto is placed into the snugly fitting hole/cavity 62 such that the contact regions 26 of the biasing members 20 touch the flex 70 and are deflected inward as the module/connector are seated atop the hole/cavity. As the connector 100 descends into the hole/cavity, the contact regions 26 wipe and come to rest against the exposed flex circuit portions 76, thereby making electrical contact between the module lead wires 52 and the flex external wiring 70. An optional fifth step of mechanically attaching the module to the mounting surface may then be performed. Additionally, it may be desirable to place locating pins or other features 68 atop the mounting surface for guiding and holding in place the flex circuit 70, so that installation is facilitated.

Thus, it can be seen how the structure of the present connector 100 enables "drop-in" connection of an electronic module 50 to an external flex circuit 70. One additional benefit provided by the connector configuration is that whenever it is desired to remove the module for service, replacement, etc., disconnection between the flex and the lead wires is automatic, as is reconnection therebetween upon re-insertion of the module (or another module) into the cavity/hole.

Various other modifications to the present invention may occur to those skilled in the art to which the present invention pertains. For example, the flex circuit 70 may not only be draped across the top surface 66, but may also be inserted from underneath/within the mounting surface. Also, although certain surfaces have been described as being perpendicular with respect to other surfaces, it is obvious that such surfaces may also be somewhat drafted so as to facilitate manufacturing and the like. Other modifications not explicitly mentioned herein are also possible and within the scope of the present invention. It is the following claims, including all equivalents, which define the scope of the present invention.

What is claimed is:

1. An electrical connection structure, comprising:
    an electronic module having at least two lead wires opposed top and bottom surfaces, and at least one side wall between and contiguous with said top and bottom surfaces;

an electrical connector comprising an electrically insulative body having generally opposed first and second major surfaces, and further comprising at least two electrically conductive generally elongate biasing members disposed generally within said body, each biasing member having first and second ends and a contact region proximate said second end, wherein each first end is exposed through said first major surface and is adapted for attachment to one of the lead wires, and wherein each contact region extends outward from said second major surface such that each contact region may be resiliently deflected inward toward said second major surface, said connector being attached to said side wall of said module such that said second major surface of said body faces outward from said module, wherein each lead wire is attached to a respective one of said first ends;

a mounting surface having a general top surface and a recess defined in said general top surface, wherein said recess generally confirms in shape with said electronic module, said recess being bound by a wall descending generally perpendicularly from said general top surface; and a flex circuit having electrically conductive circuit traces thereon each terminating in an exposed circuit trace portion at an end of said flex circuit, said flex circuit being disposed on said general top surface of said mounting surface and draped into said recess along said descending wall such that said exposed circuit trace portions are disposed upon said descending wall of said mounting surface;

wherein said module and said electrical connector are disposed within said recess such that said contact regions of said connector are in contact with and inwardly deflected by said exposed circuit trace portions, thereby electrically connecting each lead wire to a respective one of said circuit traces.

2. The structure according to claim 1, further comprising a plurality of fasteners mechanically connecting said module to said mounting surface.

3. The structure according to claim 1, further comprising two locating pins disposed on said general top surface of said mounting surface proximate said recess, each locating pin being located on a respective lateral side of said flex circuit.

* * * * *